(12) United States Patent
Engel et al.

(10) Patent No.: US 9,480,184 B1
(45) Date of Patent: Oct. 25, 2016

(54) INSTRUMENTATION CHASSIS WITHIN A MODULE

(71) Applicants: Advanced Testing Technologies, Inc., Hauppauge, NY (US); Eli Levi, Dix Hills, NY (US)

(72) Inventors: Richard Engel, Ridge, NY (US); Robert Spinner, East Northport, NY (US); Eli Levi, Dix Hills, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 0 days.

(21) Appl. No.: 14/936,415

(22) Filed: Nov. 9, 2015

Related U.S. Application Data (63) Continuation-in-part of application No. 14/487,851, filed on Sep. 16, 2014, now Pat. No. 9,295,169, and a continuation-in-part of application No. 14/695,106, filed on Apr. 24, 2015, which is a continuation-in-part of application No. 14/487,851, filed on Sep. 16, 2014, now Pat. No. 9,295,169.

(60) Provisional application No. 61/902,475, filed on Nov. 11, 2013, provisional application No. 61/878,112, filed on Sep. 16, 2013.

(51) Int. Cl.
  *H05K 7/20* (2006.01)
  *H05K 5/00* (2006.01)

(52) U.S. Cl.
  CPC ........ *H05K 7/20136* (2013.01); *H05K 5/0017* (2013.01)

(58) Field of Classification Search
  CPC .............. H05K 7/1418; H05K 7/1439; Y10T 29/49117; G01R 31/2834; G11B 33/128; G06F 1/184
  USPC ......................................................... 324/555
  See application file for complete search history.

(56) References Cited

U.S. PATENT DOCUMENTS

| 4,486,816 A | 12/1984 | Hope |
| 5,001,422 A | 3/1991 | Dahlberg et al. |
| 5,237,484 A * | 8/1993 | Ferchau .................... G06F 1/20 165/80.3 |

(Continued)

FOREIGN PATENT DOCUMENTS

CA  2354181 A1  1/2003

OTHER PUBLICATIONS

Office Action for U.S. Appl. No. 14/695,106 dated Jun. 2, 2015.

*Primary Examiner* — Benjamin M Baldridge
(74) *Attorney, Agent, or Firm* — Brian Roffe (57) ABSTRACT

A module that incorporates a chassis for enabling use of at least one smaller functional module in at least one slot of a chassis designed to mate with a larger functional module having a different standard than the smaller functional module. The module has a housing having electrical connections adapted to mate with electrical connections provided by the chassis for the larger functional module and dimensions that fit within at least one slot provided by the chassis for housing the larger functional module. The module includes at least one set of electrical connections adapted to mate with the electrical connections of the smaller functional module(s) and at least one air passage for conveying air from an opening of the chassis that provides air flow to cool the larger functional module to an area in which the smaller functional module(s) is/are situated when mated with the housing.

26 Claims, 6 Drawing Sheets

(56) References Cited

U.S. PATENT DOCUMENTS

| | | | |
|---|---|---|---|
| 5,268,637 A | 12/1993 | Liken et al. | |
| 5,600,788 A | 2/1997 | Lofgren et al. | |
| 5,794,175 A | 8/1998 | Conner | |
| 5,986,447 A * | 11/1999 | Hanners | G01R 31/31905 324/756.01 |
| 5,986,458 A | 11/1999 | Saito et al. | |
| 5,989,037 A | 11/1999 | Ruque | |
| 5,991,163 A | 11/1999 | Marconi et al. | |
| 6,163,464 A | 12/2000 | Ishibashi et al. | |
| 6,249,441 B1 | 6/2001 | Barbier et al. | |
| 6,358,095 B1 * | 3/2002 | Rootz | G01R 31/2808 439/638 |
| 6,462,532 B1 | 10/2002 | Smith | |
| 6,505,281 B1 | 1/2003 | Sherry | |
| 6,513,086 B1 * | 1/2003 | Haddad | H05K 7/1459 361/191 |
| 6,640,273 B1 | 10/2003 | Spisak et al. | |
| 6,643,798 B2 | 11/2003 | Barton | |
| 6,662,255 B1 * | 12/2003 | Klein | G06F 1/184 361/752 |
| 6,700,396 B1 * | 3/2004 | Smith | G01R 1/07314 324/750.09 |
| 6,956,379 B2 | 10/2005 | Mastoris et al. | |
| 6,975,130 B2 | 12/2005 | Yevmenenko | |
| 6,981,086 B2 | 12/2005 | Wetzel et al. | |
| 6,989,902 B2 * | 1/2006 | Mailaender | G01M 11/331 356/450 |
| 6,995,578 B2 | 2/2006 | Shibuya et al. | |
| 7,075,796 B1 | 7/2006 | Pritchett | |
| 7,092,253 B2 * | 8/2006 | Lam | G06F 1/20 312/223.3 |
| 7,138,733 B2 | 11/2006 | Sanders et al. | |
| 7,149,093 B2 * | 12/2006 | Conway | H05K 7/1461 361/679.4 |
| 7,212,412 B2 | 5/2007 | Carlson et al. | |
| 7,242,590 B1 * | 7/2007 | Yeap | G01R 31/2834 174/384 |
| 7,254,025 B2 * | 8/2007 | Baldwin, Jr. | H05K 7/20672 361/688 |
| 7,272,774 B2 | 9/2007 | Co et al. | |
| 7,348,786 B2 | 3/2008 | Thacker et al. | |
| 7,355,850 B2 * | 4/2008 | Baldwin, Jr. | H05K 7/20563 361/690 |
| 7,362,089 B2 * | 4/2008 | Kushnick | G01R 31/31907 324/756.02 |
| 7,576,997 B2 | 8/2009 | Brolin | |
| 8,138,778 B1 | 3/2012 | Smith | |
| 8,446,722 B2 | 5/2013 | Fowler | |
| 8,656,229 B2 | 2/2014 | Elserougi et al. | |
| 2002/0090844 A1 | 7/2002 | Kocin | |
| 2002/0131257 A1 | 9/2002 | Agard | |
| 2006/0090100 A1 | 4/2006 | Holzapfel | |
| 2007/0291905 A1 | 12/2007 | Halliday | |
| 2009/0106761 A1 | 4/2009 | Chandhoke | |
| 2009/0219702 A1 | 9/2009 | Mazura et al. | |
| 2010/0079151 A1 | 4/2010 | Nordstrom et al. | |
| 2011/0255574 A1 * | 10/2011 | Carter | H04L 29/04 375/214 |
| 2012/0117289 A1 * | 5/2012 | Morgan | G06F 13/385 710/301 |
| 2013/0057074 A1 * | 3/2013 | Takano | H01M 2/1072 307/66 |
| 2013/0201278 A1 | 8/2013 | Chang | |
| 2013/0329392 A1 | 12/2013 | Czuba et al. | |

* cited by examiner

INSTRUMENTATION CHASSIS WITHIN A MODULE

CROSS REFERENCE TO RELATED APPLICATIONS

This application is a continuation-in-part of U.S. patent application Ser. No. 14/487,851, filed Sep. 16, 2014, which claims priority under 35 U.S.C. §119(e) of U.S. provisional patent application Ser. Nos. 61/878,112, filed Sep. 16, 2013, and 61/902,475, filed Nov. 11, 2013; and a continuation-in-part of U.S. patent application Ser. No. 14/695,106, filed Apr. 24, 2015, which is a continuation-in-part of U.S. patent application Ser. No. 14/487,851, filed Sep. 16, 2014, which claims priority under 35 U.S.C. §119(e) of U.S. provisional patent application Ser. Nos. 61/878,112, filed Sep. 16, 2013, and 61/902,475, filed Nov. 11, 2013, all of which are incorporated by reference herein.

FIELD OF THE INVENTION

The present invention relates generally to automated test systems that utilize modular instrumentation that is intended to be housed within a standardized chassis.

BACKGROUND OF THE INVENTION

The evolution of test instrumentation has transitioned over the years from a situation where a single stand-alone box that would typically provide a single dedicated function to one where a multitude of standardized chassis now have the ability to house a plurality of modules, with each module providing a dedicated function so that with a single chassis, multiple functions can be provided.

Bulky test stations for testing complex pieces of equipment using a rack-and-stack approach have largely morphed into significantly smaller footprints through the use of the modular instrumentation. Rack-and-stack implementations may still be used where instrumentation dictates a stand-alone unit (i.e., a display) but over time, even units requiring displays have also gone 'faceless' to reduce complexity. The benefits of a modular approach are readily apparent, including for example, redundant functions (control, cooling, power) are eliminated which in turn results in a reduction of size and an increase in overall station reliability.

Over the past 30 years or more, a number of standardized chassis (sometimes referred to as 'crates') have been implemented including, but not limited to: MMS, Eurocard, VERSAbus, VMEbus, VXI, VPX, PCI, PXI and AXIe to name a few (the full terms of these abbreviations are known to those skilled in the art to which this invention pertains). While the modular approach has many benefits, one drawback is most systems typically have unused chassis space. Some systems intentionally allocate unused space for future expansion while in others, it is simply the result of how the system was populated. Over time, as existing instrumentation is deemed obsolete by the original equipment manufacturers (OEMs), it is often replaced by a different (or even new) modular form factor which might not be currently implemented within a test station.

SUMMARY OF THE INVENTION

An object of at least one embodiment of the present invention is to provide a chassis that is capable of being installed within a larger chassis of a different form factor through the use of a specialized module.

The inner (smaller) chassis is part of an adapter that enables use of at least one smaller functional module in at least one slot of the larger chassis. The outer form/fit of the adapter is implemented such that it mates with and is housed within the larger chassis. The adapter includes a housing having electrical connections adapted to mate with electrical connections provided by the larger chassis for the larger functional module and dimensions that fit within at least one slot provided by the larger chassis for housing the larger functional module. The housing includes at least one set of electrical connections adapted to mate with the electrical connections of the smaller functional module, and at least one air passage for conveying air from an opening of the larger chassis that provides air flow to cool the larger functional module to an area in which the smaller functional module is situated when mated with the housing.

The housing also includes electrical wiring or componentry that functionally separates or isolates address and/or data signals being received at the electrical connections provided by the larger chassis that are not needed at the electrical connections adapted to mate with the electrical connections of the smaller functional module.

A control system enables user selection of auxiliary signals being transferred between the chassis and the smaller functional module(s). A signal conditioning system conditions auxiliary signals being transferred between the larger chassis and the smaller functional module(s). At least one booster fan may be provided to increase air flow to the area in which the smaller functional module is situated when mated with the housing. A power altering system alters transfer of electrical power from the larger chassis to any smaller functional modules. The power altering system may include a DC-DC converter, be user configurable and possibly include a switch and a connection for external power and/or a power supply on the housing.

In one embodiment, the housing includes two sets of electrical connections each adapted to mate with the electrical connections of a respective one of two smaller functional modules and has dimensions that fit within a single slot provided by the chassis for housing a single larger functional module. In another embodiment, the housing includes eight sets of electrical connections each adapted to mate with the electrical connections of a respective one of eight smaller functional modules and has dimensions that fit within three slots provided by the chassis for housing three of the larger functional modules.

The air passage may include a duct at a bottom of the housing that conveys airflow from the opening of the chassis, e.g., at least partly aligns therewith. In this case, the housing includes at least one opening along an upper wall portion defining the duct that is positioned to underlie smaller functional modules when mated with the housing.

A method for enabling use of at least one smaller functional module in at least one slot of a chassis designed to mate with a larger functional module having a different standard than the smaller functional module in accordance with the invention includes connecting electrical connections of a housing to electrical connections provided by the chassis for the larger functional module, the housing having dimensions that fit within at least one slot provided by the chassis for housing the larger functional module, connecting each smaller functional module to a respective set of electrical connections on the housing, and conveying air from an opening of the chassis that provides air flow to cool the larger functional module through at least one air passage of the housing to an area in which smaller functional modules may be situated.

The method may include separating or isolating address and/or data signals being received at the set of electrical connections provided by the larger chassis that are not needed at the electrical connections connected to the electrical connections of the smaller functional module by means of electrical wiring or componentry. It is possible to enable user selection of auxiliary signals being transferred between the chassis and any smaller functional module. It is also possible to condition auxiliary signals being transferred between the chassis and any smaller functional module, and increase air flow to the area in which any smaller functional module is situated. Transfer of electrical power from the chassis to any smaller functional module may be altered as mentioned above.

An arrangement in accordance with the invention includes an automated test equipment chassis defining at least one slot for a larger functional module. The automated test equipment includes other structure, e.g., hardware and software, to enable its operation to test equipment in a manner like known automated test equipment operates. The arrangement includes an adapter that enables use of at least one smaller functional module in at least one slot that has a different standard than the larger functional module. The adapter may have any construction described above.

The invention will be described in detail with reference to some preferred embodiments of the invention illustrated in the figures in the accompanying drawings. However, the invention is not confined to the illustrated and described embodiments alone.

BRIEF DESCRIPTION OF THE DRAWINGS

Additional objects of the invention will be apparent from the following description of the preferred embodiment thereof taken in conjunction with the accompanying non-limiting drawings, in which.

DETAILED DESCRIPTION OF THE INVENTION

In an effort to reclaim unused space, a primary intent of this invention is to implement a standardized chassis within a module of a dissimilar standardized chassis in a sort of commensal symbiotic relationship. This invention relates to a chassis for instrumentation or an instrumentation chassis within a module. However, to enumerate each and every chassis permutation ad nauseam serves no practical purpose, so for the sake of clarity and convenience, the descriptions herein will be limited to C-Size VXI and PXI modules due to their ubiquitous presence throughout the test instrumentation industry. The invention is in no way constrained to using only these form factors/standards or modules and to those skilled in the art could readily adapt current and future standardized chassis within a module adapter of dissimilar standard, in view of the teachings disclosed herein.

Preferred embodiments of the invention will be described with reference to FIGS. 1-4 wherein like reference numerals refer to the same or similar elements. In order to implement a chassis within a module, the physical module sizes that are needed to be supported by the equipment 40 must first be determined. In terms of physical sizes, the larger dimension (height, width, depth) of the desired modules will be the key determining factor as to how the adapter is implemented.

As used herein, the adapter will be considered a housing having the size of a larger module and configured to retain one or more of the smaller modules, providing electrical connectivity and physical fit for the smaller module(s) within a chassis designed to receive the larger module. Otherwise, the smaller module(s) could not be used with the chassis since their size and connections do not correspond to those provided by the chassis.

In the case of the aforementioned C-Size VXI and PXI modules, both are based on the 6U Eurocard standard, both utilize common power supply voltages and both utilize bottom entry vertical airflow cooling. These similarities result in ideal conditions for a chassis that supports both types of modules. In the case of PXI modules, they are available in both 3U (much more prevalent) and 6U variants—one or more of the embodiments of the proposed invention would be capable of supporting both types.

As an example, if it is desired to use both PXI and VXI modules, the typical 3U PXI modules are roughly half the height of a typical C-Size VXI module and are an ideal candidate to be housed within the confines of a chassis housing having the properties of a (larger) VXI module. The larger chassis (main chassis 40) houses an adapter module 42 which implements a PXI chassis (smaller, inner chassis) to allow mounting, powering, cooling and control of PXI modules 44. Equipment 40 will also be referred to as VXI chassis since it is designed to receive VXI modules.

Figure 1:
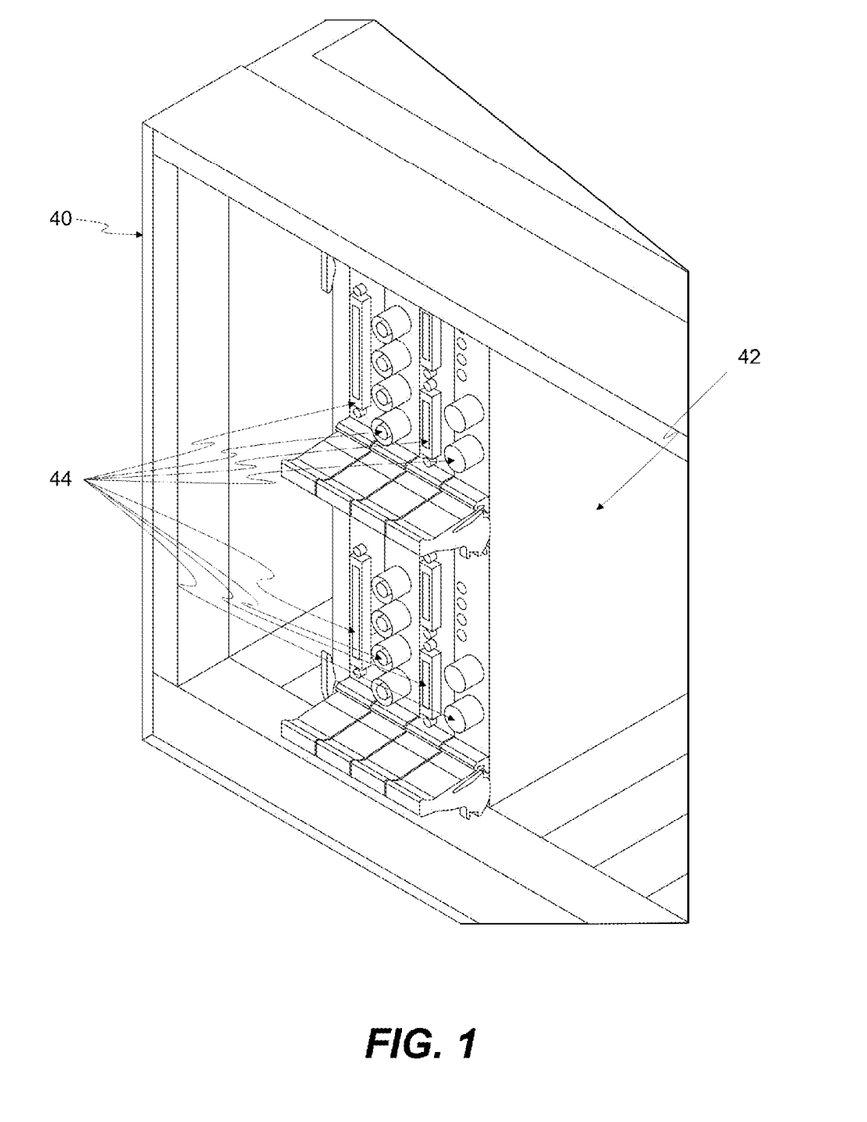
FIG. 1 shows an exemplifying, non-limiting physical implementation of a PXI chassis within a VXI module configuration.
Figure 4:
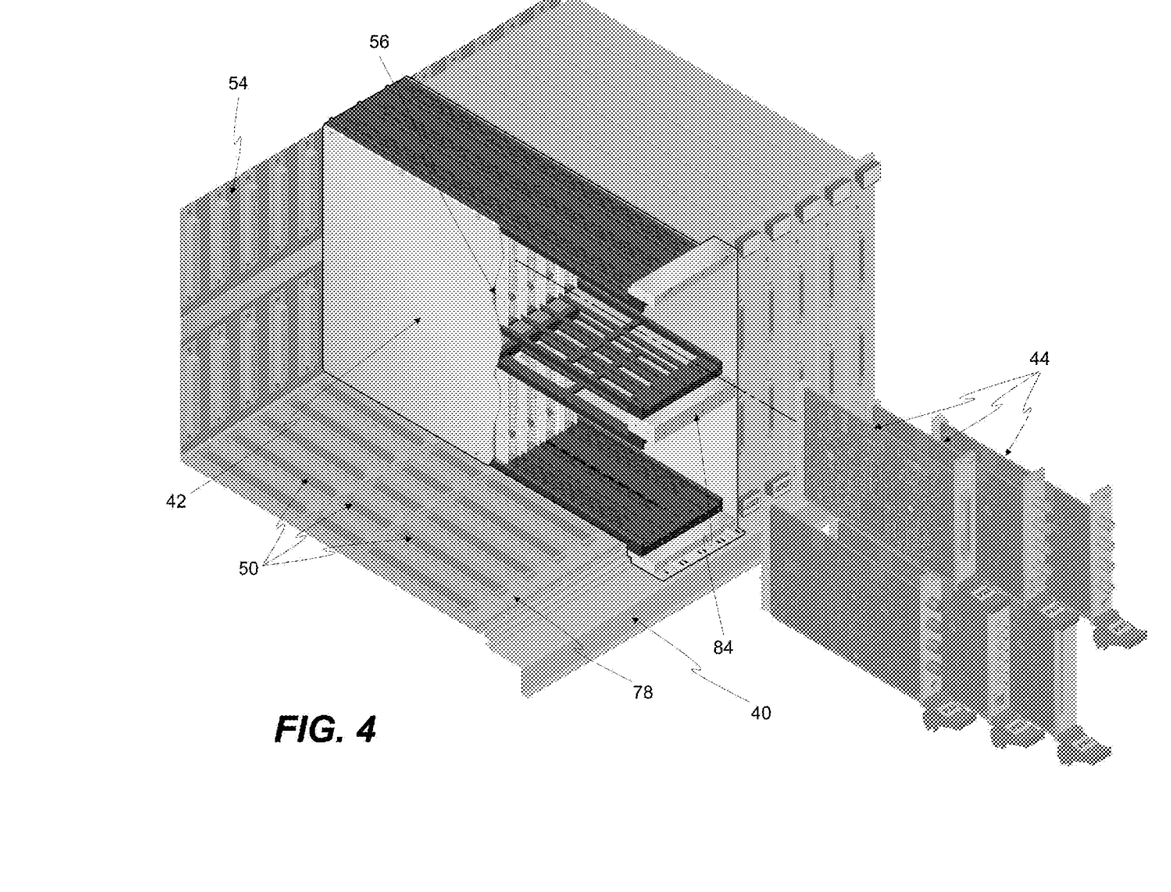
FIG. 4 is a perspective view showing insertion of six 3U PXI modules into a PXI chassis implemented within a C-Size VXI module.

FIG. 1 shows such as an adapter 42 (installed) which has the shape and electrical connections of a VXI module, but is designed to retain eight PXI modules 44. A PXI chassis resident within an envelope of a single slot VXI module is capable of housing two PXI slots and thus two PXI modules. An adapter having the properties of a double slot VXI module is capable of housing four (or possibly six) PXI slots and thus four or six PXI modules. An adapter having the properties of a triple slot VXI module (as shown in FIG. 4) is capable of housing eight PXI slots and modules 44 therein, with wider modules housing even greater capacities. Wider/larger modules increase complexity as additional PXI slots would necessitate the implementation of a hardware bridge.

FIG. 1 reflects a typical orientation of the inner PXI modules, and alternate embodiments may rotate orientation of some or all of these modules by 90°, 180° or 270°. The invention is not limited by such orientation and in alternate embodiments, the PXI modules 44 may be oriented differently. Space consideration, for example, may be factor when determining the orientation of the PXI modules.

With reference to the VXI and PXI modules, the cooling specification per slot is 40 watts and 25 watts respectively. Structure may be provided in the adapter 42, i.e., the adapter having the properties of a VXI module, to enable cooling of the PXI modules 44 placed into PXI-compatible slots defined by the adapter 42.

Figure 2:
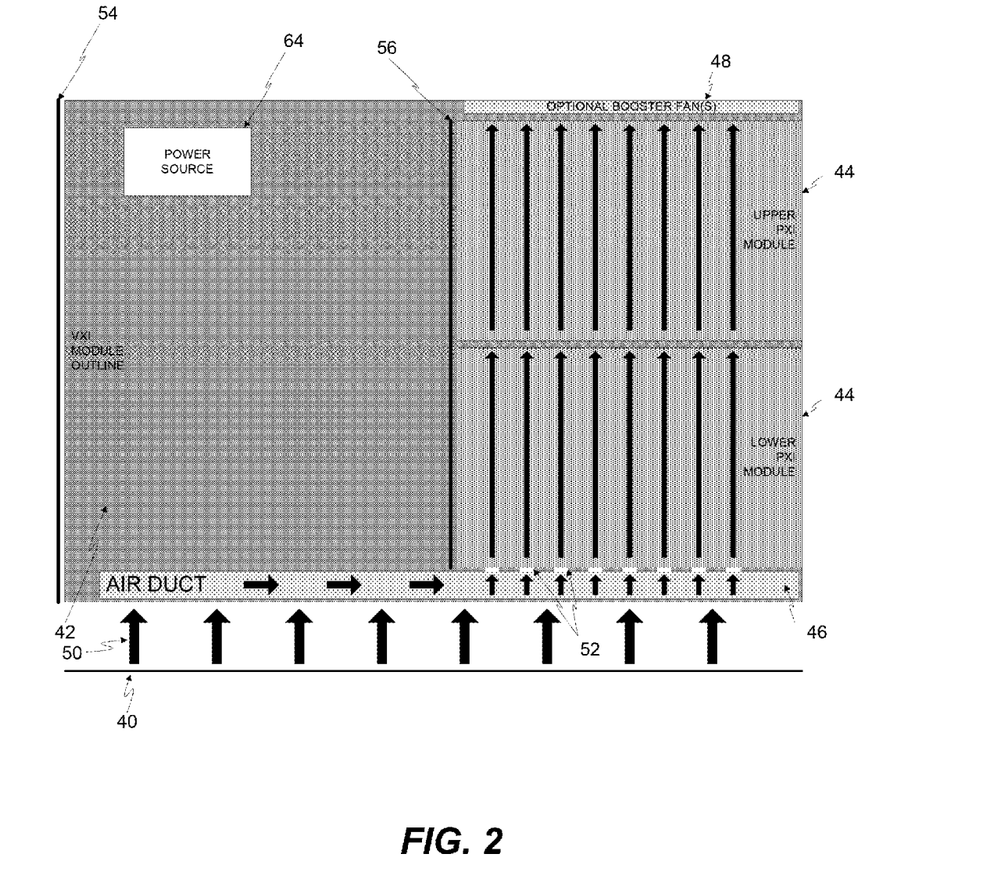
FIG. 2 shows a side view of the installation of two smaller 3U PXI modules within a chassis having the physical properties of a larger VXI chassis and reflects how cooling air is directed through the assembly.

Since both standards utilize forced airflow cooling that pass across the module vertically, incorporating a PXI chassis within the footprint of an adapter having the properties of a VXI module is easily accommodated through the use of interior ducts to direct airflow as shown in FIG. 2. Specifically, a main air duct 46 is formed in the adapter 42. This means that the adapter 42 has walls defining a conduit for air, e.g., a lower wall portion, side wall portions and an upper wall portion which cooperate to create the main air duct 46.

This main air duct 46 has openings along a bottom area to receive the airflow (represented by the large arrows directed upward) from one or more ducts or elongate module passages 50 of the VXI chassis or other equipment 40 that is housing the adapter 42. Thus, the lower wall portion of the adapter 42 is provided with these openings The bottom portion of the chassis 40 may be provided with the module passages 50 as mentioned above (see FIG. 4 which shows several rows of elongate module passages, there being any number of such module passages in different embodiments of the invention).

The main equipment chassis 40 includes slots 78 in which connectors are arranged on the backplane and thus, the equipment includes the elongate module passages 50. Each module passage 50 at least partly aligns with a respective slot and is configured to be situated alongside a respective adapter 42 when engaged with the connector of the respective slot. The module passages 50 may be interconnected to allow for supply of air to all of the module passages from a common inlet of air into the equipment 40 or chassis.

The main air duct 46 of the adapter 42 also includes openings 52 along a top, i.e., the upper wall portion, that lead to areas of the adapter 42 in which the PXI modules 44 will be positioned. The air flow thus flows laterally alongside the broad surfaces of the PXI modules 44 (represented by the long, narrow arrows). Those portions of the main air duct 46 that do not underlie PXI modules 44 are may restrict airflow to these areas in order to direct additional airflow across the PXI modules. If active circuitry is implemented (i.e. signal conditioning, power altering, etc.) some airflow across this circuitry may be required. Systems which do not implement active circuitry or utilize conductive cooling my block off those areas in order to maximize airflow across the PXI modules.

Since the cooling capacity provided by the VXI chassis or other equipment 40 for a VXI module normally housed in the VXI slot (40 watts) is not twice that of the cooling required by a PXI module in a PXI slot (25 watts), the cooling capacity of the upper/lower PXI module pair would normally be limited to about 40 watts instead of about 50 watts or roughly 80% of the normal PXI rating.

In a preferred embodiment, an optional plurality of booster fans 48 may be used to increase the airflow across the PXI modules 44 so that no cooling de-rating would be necessary. These booster fans 48 may be placed in-line (serially) or placed in such a manner to pump additional airflow into the lower, main air duct 46 to augment the airflow from the VXI chassis or other equipment 40. Other implementations of a chassis within a module would require similar analysis of physical constraints and airflow requirements, and placement of optional airflow boosting structure to augment the airflow if necessary or desired.

Accordingly, the adapter 42 optionally includes mounting structure (not shown) to mount one or more of the booster fans 48 above the spaces defined by the adapter 42 for receiving the PXI modules 44. In a preferred embodiment, a removable divider 84 can be installed within the PXI segment, or portion thereof, to allow the use of 3U PXI cards and/or 6U PXI cards within the module adapter 42 (see FIG. 4).

In terms of electrical compatibility, the intent is to generally isolate the signals present within the VXI chassis or other equipment 40 from those within the PXI modules 44 to prevent commingling of signals. Specifically, address and data buses between standards/form factors must remain isolated from one another in order to avoid contention between control functions of the VXI chassis and PXI chassis. Each chassis would have its own dedicated controller to make use of existing and plentiful hardware while also minimizing compatibility issues as controllers known to work with a certain configuration can be maintained. Particular importance must be given to isolation, signal crosstalk, impedance and current capacity across the different signal types needed to support the new chassis. There are instances where it might prove beneficial to allow limited interaction between the VXI chassis and the PXI chassis.

In a preferred embodiment, the user would be able to configure/select one or more trigger bus signals to pass through the VXI-PXI module adapter 42 to allow triggering between instrumentation. This may hold true for local bus signals as well. To this end, the electrical componentry in the adapter 42 may be controlled or programmed by the user to provide for the user selectability of the trigger bus signals. This control aspect is represented schematically as 60 in FIG. 3, and may be implemented by control systems known to those skilled in the art. For example, a command signal may be generated by control system 60 and directed to the adapter 42 to effect the desired user control of the trigger bus signals or may be simply set via hardware jumper.

Embodiments for other chassis standards/form factors may need to implement active circuitry to perform signal conditioning and/or level translation to insure compatibility between the signals of the chassis to be used. To this end, a signal conditioning system 62 may be housed on or associated with the adapter 42 and coupled to one or more of the signals being transferred between the VXI chassis or other equipment 40 and the PXI modules 44.

Figure 3:
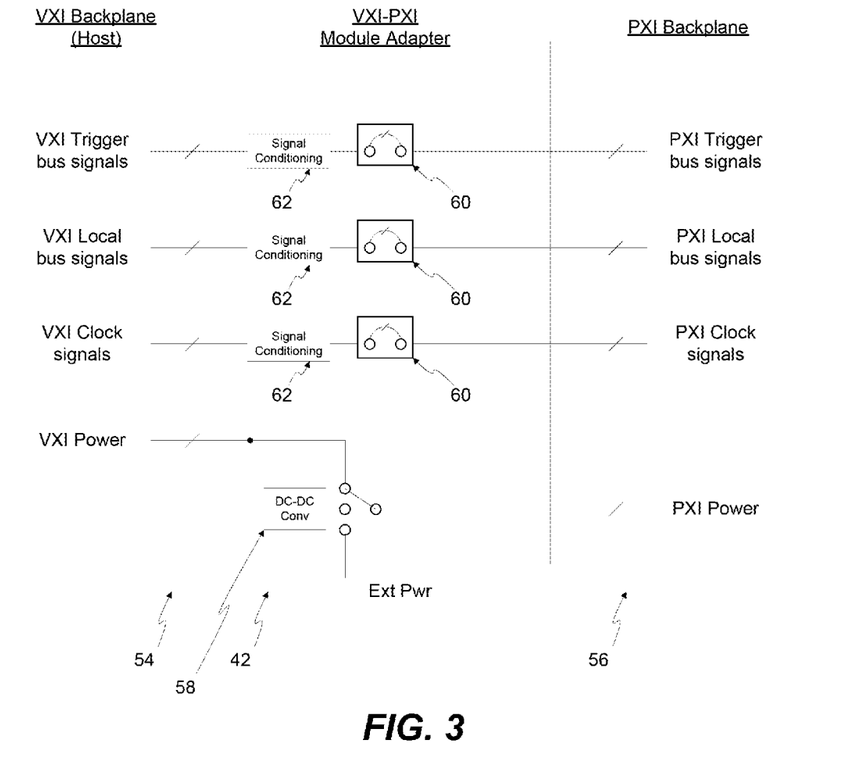
FIG. 3 reflects how signal interaction can be configured between the main VXI chassis and the PXI chassis implemented within the VXI module.

Referring still to FIG. 3, the VXI chassis or other equipment 40 includes a VXI backplane (host) 54 which is wired to provide auxiliary signals, such as VXI trigger bus signals, VXI local bus signals, VXI clock signals, and VXI power. These signal connections would normally connect to respective corresponding signals paths and connectors on a VXI module if housed in the VXI chassis. Indeed, since the VXI chassis or other equipment 40 may include a plurality of VXI slots, it is conceivable that one of these slots is occupied by a VXI module and another one of the slots is occupied by the adapter retaining two PXI modules. The VXI chassis or other equipment is therefore useful for retaining multiple, different types of modules.

When used with the adapter 42 however, the adapter 42 includes various electrical connections and/or components to convert the various signals and provide suitable PXI connections on a PXI backplane 56 defined by the adapter 42. Thus, the VXI trigger signals are converted to PXI trigger signals, the VXI local bus signals are converted to PXI local bus signals and the VXI clock signals and converted to PXI clock signals. Also, the VXI power is converted to PXI power, possibly with use of an external power source 64, or a DC-DC converter 58.

More specifically, for clock distribution, any clocks present within the outer VXI chassis or other equipment 40 could be passed to the PXI module 44 through adapter 42 in instances where coherent timing is necessary. In a preferred embodiment, the various clock signals sourced by the PXI module 44 would be routed through an active clock distribution system to insure high isolation/buffering between the VXI chassis or other equipment 40 and the PXI modules 44 and may optionally include clock multiplier/divider circuitry to keep clocks of different frequencies coherent between the VXI chassis or other equipment 40 and the PXI modules 44.

Alternative embodiments that do not require high isolation may use simpler passive or active circuits for sourcing these clock signals. Such active clock distribution systems and passive or active circuits for sourcing clock signals would be readily available or constructable by those skilled in the art to which this invention pertains in view of the disclosure herein.

The PXI chassis power supply specifications require voltages of +5 VDC, +3.3 VDC, +12 VDC and −12 VDC. Older VXI chassis (prior to revision 4.0 of the VXI specification) have sufficient current capacity to support the +5 VDC, +12 VDC and −12 VDC requirements but were not required to include a +3.3 VDC power rail. VXI chassis that satisfy revision 4.0 have included additional pins that accommodate the +3.3 VDC power rail. In a preferred embodiment, all voltages required by the PXI modules 44 could be user configured within the module adapter 42 as to where each voltage is derived from. The most direct implementation would utilize power sourced directly from the VXI chassis or other equipment 40. Instrumentation that may be subjected to harsh environments or operate in sensitive environments may necessitate the need for other embodiments in which multiple isolated voltage sources are implemented through the use of DC-DC converters. In cases where the PXI modules requires a voltage not available within the VXI chassis or other equipment 40, this voltage can be created through the use of a plurality of DC-DC converters 58 or even a power source/supply 64 that resides within the module chassis adapter 42 (see FIG. 3).

In an alternative embodiment, voltages for use within the PXI modules 44 could be configured to utilize one or more external sources of DC power or implement dedicated power supplies within the module chassis adapter 42. This is reflected in general terms in FIG. 3.

Figure 5:
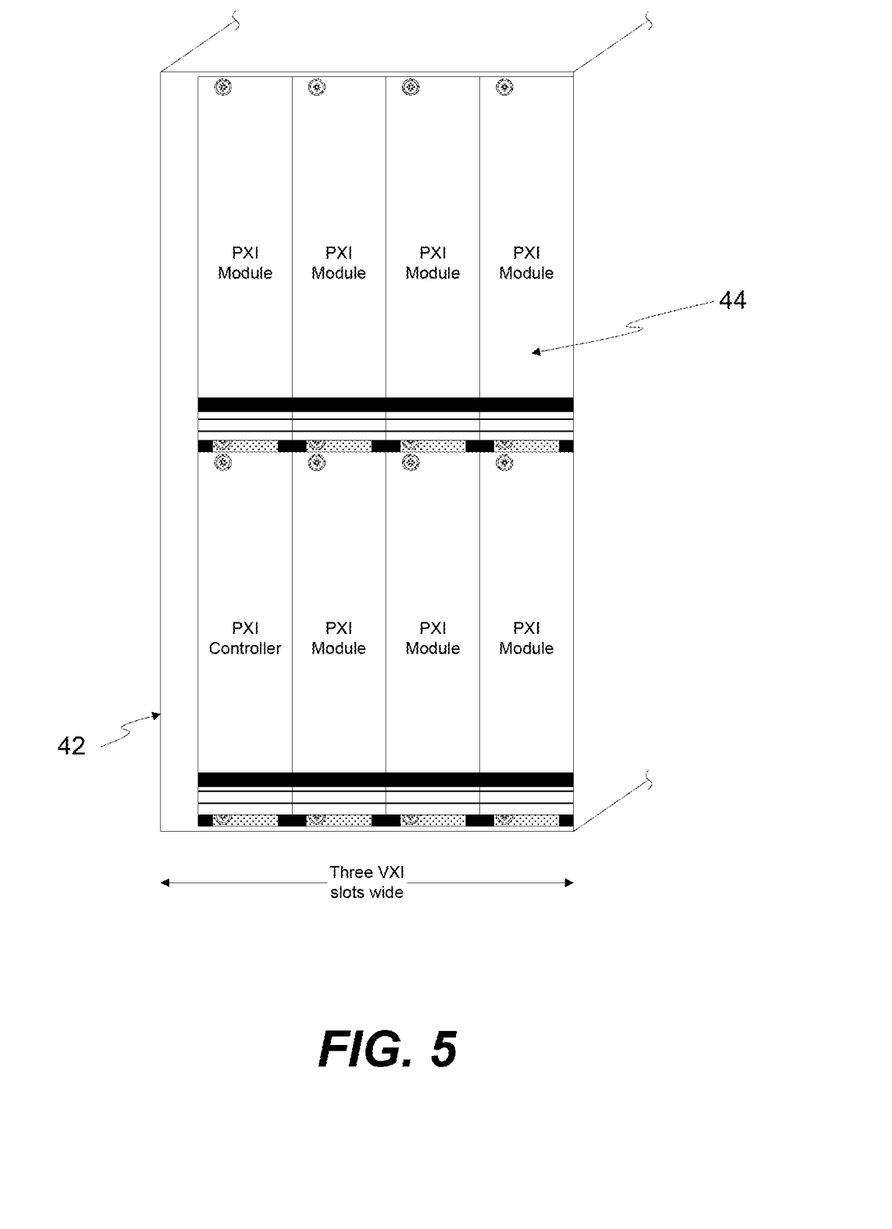
FIG. 5 is a front view of an adapter including a housing having eight PXI modules adapted to fit within three VXI slots.

FIG. 5 is a front view of an adapter including a housing having eight sets of electrical connections each adapted to mate with the electrical connections of a respective PXI functional modules. The housing has dimensions, i.e. a width and height, that fit within three slots provided by the chassis for housing three of the larger functional modules, e.g., VXI modules.

Figure 6:
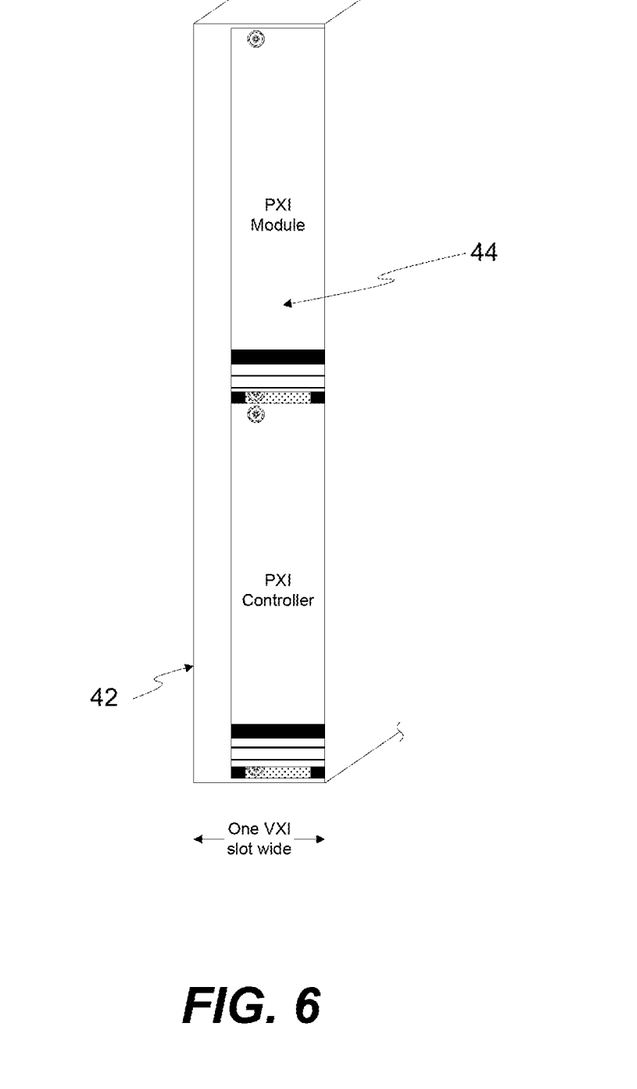
FIG. 6 is a front view of an adapter including a housing having two PXI modules adapted to fit within a single VXI slot.

FIG. 6 is a front view of an adapter including a housing having two sets of electrical connections each adapted to mate with the electrical connections of a respective PXI functional modules, one on top of the other. The housing has dimensions, i.e. a width and height, that fit within a single slot provided by the chassis for housing one of the larger functional modules, e.g., a single VXI module.

Various different adapters may be manufactured to mate with different numbers of smaller functional modules and fit within various numbers of slots for the larger functional modules. The particular ratio depends on the relative size of the smaller functional modules and slot size for the larger functional modules.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and is not limiting. The invention is limited only as defined in the claims and equivalents thereto.

The invention claimed is:

1. An adapter for using at least one smaller functional module in at least one slot of a chassis designed to mate with a larger functional module having a different standard than a standard of the smaller functional module, comprising:

a housing having a first set of electrical connections that mate with electrical connections provided by the chassis for the larger functional module, having the same dimensions as the larger functional module that fits within the at least one slot provided by the chassis for housing the larger functional module;

said housing including at least one functional-module receiving slot in an interior thereof having an opening at one end, said at least one functional-module receiving slot configured to receive one of the at least one smaller functional module, inserted into said functional-module receiving slot through said opening at the end of said functional-module receiving slot, said housing including at least one second set of electrical connections, each of said at least one second set of electrical connections being exposed in a respective one of said at least one functional-module receiving slot and configured to mate with electrical connections of the at least one smaller functional module when received in said at least one functional-module receiving slot included in said housing; and said housing further including at least one air passage having at least one inlet through which air flow from the chassis is received when said first set of electrical connections of said housing is mated with the electrical connections provided by the chassis and at least one outlet leading to said at least one functional-module receiving slot included in said housing, said at least one air passage being configured to convey air from an opening of the chassis that provides air flow to said at least one functional-module receiving slot included in said housing to thereby cool the at least one smaller functional module when mated with said at least one second set of electrical connections of said housing and received in the respective one of said at least one functional-module receiving slot included in said housing.

2. The adapter of claim 1, wherein said housing further comprises electrical wiring or componentry that functionally separates or isolates address and/or data signals being received at said first set of electrical connections that are not needed at said at least one second set of electrical connections configured to mate with the electrical connections of the at least one smaller functional module.

3. The adapter of claim 1, further comprising a control system that enables user selection of auxiliary signals being transferred between the chassis and the at least one smaller functional module.

4. The adapter of claim 1, further comprising a signal conditioning system that conditions auxiliary signals being transferred between the chassis and the at least one smaller functional module.

5. The adapter of claim 1, further comprising at least one booster fan arranged in said housing for increasing air flow to said at least one functional-module receiving slot included in said housing in which the at least one smaller functional module is situated when mated with said housing.

6. The adapter of claim 1, further comprising a power altering system that alters transfer of electrical power from the chassis to the at least one smaller functional module.

7. The adapter of claim 6, wherein said power altering system comprises a DC-DC converter.

8. The adapter of claim 6, wherein said power altering system is user configurable.

9. The adapter of claim 6, wherein said power altering system includes a switch and a connection for external power.

10. The adapter of claim 6, wherein said power altering system includes a power supply on said housing.

11. The adapter of claim 1, wherein said at least one second set of electrical connections includes two second sets of electrical connections and said housing has dimensions that fit within only a single slot provided by the chassis for housing a single larger functional module, said at least one functional-module receiving slot included in said housing including a first slot and a second slot arranged vertically above said first slot, said at least one air passage being situated below said first slot, said at least one outlet being situated between said at least one air passage and said first slot.

12. The adapter of claim 1, wherein said at least one second set of electrical connections includes eight second sets of electrical connections and said housing has dimensions that fit within three slots provided by the chassis for housing three of the larger functional modules, said at least one functional-module receiving slot included in said housing including four vertical pairs of slots, in each vertical pair, a first slot being arranged vertically below a second slot, said at least one air passage being situated below said first slot of each of said four vertical pairs of slots.

13. The adapter of claim 1, wherein said at least one air passage comprises a duct at a bottom of said housing, said duct at least partly aligning with the opening of the chassis, said housing further comprising at least one opening along an upper wall portion including said duct that is positioned to underlie said at least one functional-module receiving slot included in said housing in which the at least one smaller functional module is received when mated with said housing.

14. The adapter of claim 1, wherein said housing is elongate and has a first end and a second end opposite said first end, said first set of electrical connections being situated at said first end, said at least one functional module receiving slot included in said housing comprising two slots arranged vertically one above the other, said opening of each of said two slots being situated at said second end, further comprising a divider that separates said two slots from one another.

15. The adapter of claim 1, wherein said at least one second set of electrical connections includes a plurality of second sets of electrical connections and said housing has dimensions that fit within only a single slot provided by the chassis for housing a single larger functional module, said at least one functional module receiving slot included in said housing including a first slot and a second slot arranged alongside said first slot.

16. The adapter of claim 1, wherein said at least one second set of electrical connections includes a plurality of second sets of electrical connections and said housing has dimensions that fit within a plurality of slots provided by the chassis for housing a respective plurality of the larger functional modules, said at least one functional module receiving slot included in said housing including a plurality of slots.

17. A method for using at least one smaller functional module in at least one slot of a chassis designed to mate with a larger functional module having a different standard than a standard of the smaller functional module, comprising:
connecting a first set of electrical connections of a housing to electrical connections provided by the chassis for the larger functional module, the housing having the same dimensions as the larger functional module that fits within at least one slot provided by the chassis for housing the larger functional module, the housing including at least one functional-module receiving slot in an interior thereof, each of the at least one functional-module receiving slot having an opening at one end and the housing including at least one second set of electrical connections, each of the at least one second set of electrical connections being exposed in a respective one of the at least one functional-module receiving slot included in the housing, the housing further including at least one air passage connecting each of the at least one smaller functional module to a respective one of the at least one second set of electrical connections on the housing by inserting the smaller functional module into a respective functional-module receiving slot through the opening at the end of the functional-module receiving slot and engaging electrical connections of the smaller functional module to the second set of electrical connections exposed in the functional-module receiving slot; and
conveying air from an opening of the chassis that provides air flow through at least one inlet to the at least one air passage of the housing and then from the at least one air passage through at least one outlet leading to the at least one functional-module receiving slot included in the housing, to thereby cool the at least one smaller functional module when the at least one smaller functional module is mated with the at least one second set of electrical connections of the housing and received in the respective one of the at least one functional-module receiving slot included in the housing.

18. The method of claim 17, further comprising separating or isolating address and/or data signals being received at the electrical connections provided by the chassis that are not needed at the at least one second set of electrical connections connected to the electrical connections of the at least one smaller functional module by means of electrical wiring or componentry.

19. The method of claim 17, further comprising enabling user selection of auxiliary signals being transferred between the chassis and the at least one smaller functional module.

20. The method of claim 17, further comprising conditioning auxiliary signals being transferred between the chassis and the at least one smaller functional module.

21. The method of claim 17, further comprising increasing air flow to the at least one functional-module receiving slot included in the housing in which the at least one smaller functional module is situated.

22. The method of claim 17, further comprising altering transfer of electrical power from the chassis to the at least one smaller functional module.

23. The method of claim 17, wherein the housing is elongate and has a first end and a second end opposite the first end, the first set of electrical connections being situated at the first end, the at least one functional module receiving slot included in the housing comprising two slots arranged vertically one above the other, the opening of each of the two slots being situated at the second end, the housing further comprising a divider that separates the two slots from one another, and     wherein the step of connecting each of the at least one smaller functional module to a respective one of the at least one second set of electrical connections on the housing comprises inserting each of two smaller functional modules into a respective one of the two slots through the opening at the end of the respective slot and engaging electrical connections of the smaller functional module to the second set of electrical connections exposed in the respective slot.

24. An arrangement, comprising:

an automated test equipment chassis including at least one slot for a larger functional module, said chassis including electrical connections for mating with the larger functional module: and an adapter that receives at least one smaller functional module in said at least one slot included in said chassis that has a different standard than a standard of the larger functional module, said adapter including a housing having a first set of electrical connections configured to mate with said electrical connections provided by said chassis for mating with the larger functional module, the housing having the same dimensions as the larger functional module that fits within said at least one slot included in said chassis, said housing including at least one functional-module receiving slot in an interior thereof, wherein each functional module receiving slot includes an opening at one end, wherein each of said at least one functional module receiving slot included in said housing is configured to receive a respective one of the at least one smaller functional module insertable into said functional module receiving slot through said opening at the end of said functional module receiving slot, said housing including at least one second set of electrical connections, each of said at least one second set of electrical connections being exposed in a respective one of said at least one functional module receiving slot included in said housing and configured to mate with the electrical connections of the at least one smaller functional module when received in the respective one of said at least one functional module receiving slot in said housing, and said housing further including at least one air passage having at least one inlet through which air flow from the chassis is received when said first set of electrical connections of said housing is mated with the electrical connections provided by the chassis and at least one outlet leading to said at least one functional module receiving slot in said housing, said at least one air passage being configured to convey air from an opening of said chassis that provides air flow to said at least one functional module receiving slot in said housing to thereby cool the at least one smaller functional module when mated with said at least one second set of electrical connections of said housing and received in the respective one of said at least one functional module receiving slot in said housing.

25. The arrangement of claim 24, wherein said housing is elongate and has a first end and a second end opposite said first end, said first set of electrical connections being situated at said first end, said at least one functional module receiving slot included in said housing comprising two slots arranged alongside one another, said opening of each of said two slots being situated at said second end, further comprising a divider that separates said two slots from one another.

26. The arrangement of claim 24, wherein each of the at least one smaller functional module is smaller in at least one of width, depth or height than the larger functional module, the arrangement further comprising the at least one smaller functional module which includes a PXI module and the larger functional module which is a VXI module.

* * * * *